Figure 1:
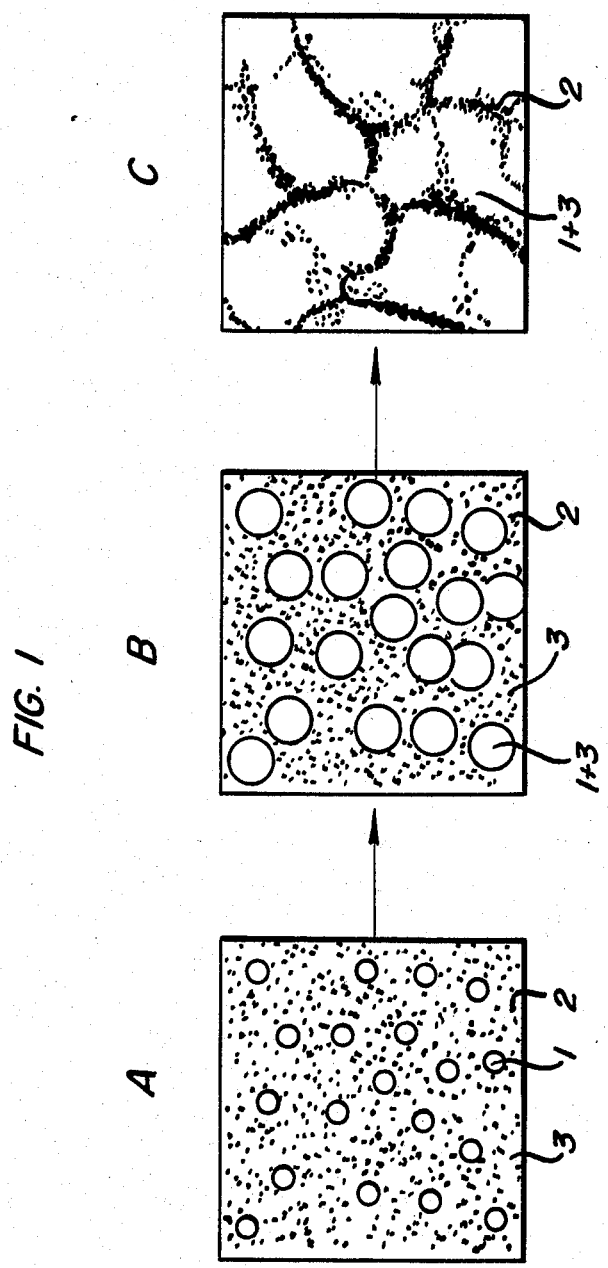

United States Patent [19]

Lin

[11] Patent Number: 4,581,158

[45] Date of Patent: * Apr. 8, 1986

[54] CONDUCTIVE THERMOSETTING COMPOSITIONS AND PROCESS FOR USING SAME

[75] Inventor: Shiow C. Lin, Ellicott City, Md.

[73] Assignee: W. R. Grace & Co., New York, N.Y.

[ * ] Notice: The portion of the term of this patent subsequent to Mar. 11, 2003 has been disclaimed.

[21] Appl. No.: 654,140

[22] Filed: Sep. 26, 1984

[51] Int. Cl.$^4$ .............................................. H01B 1/06
[52] U.S. Cl. .................................... 252/511; 252/512; 252/513; 252/514; 524/439; 524/440; 524/441; 523/457; 523/458; 523/459; 523/468
[58] Field of Search ............... 252/502, 503, 510, 511, 252/512, 513, 514, 506; 523/457–459, 468; 524/439, 440, 441, 495, 496

[56] References Cited

U.S. PATENT DOCUMENTS

| Re. 30,274 | 5/1980 | Bolon et al. | 252/514 |
|---|---|---|---|
| 3,412,043 | 11/1968 | Gilliland | 252/514 |
| 3,609,104 | 9/1971 | Ehrreich et al. | 252/511 |
| 3,746,662 | 7/1973 | Aldeman | 252/513 |
| 3,968,056 | 7/1976 | Bolon et al. | 252/514 |
| 4,410,457 | 10/1983 | Fujimura et al. | 252/512 |

Primary Examiner—Josephine L. Barr
Attorney, Agent, or Firm—Richard P. Plunkett; William W. McDowell, Jr.

[57] ABSTRACT

This invention is directed to a process and a novel composition for forming a conductive thermoset material which comprises admixing (a) particles of a polymeric material swellable at its plasticization temperature,
(b) at least one liquid reactive plasticizer for (a)
(c) optionally and preferably a curing agent for the reactive plasticizer, and
(d) heat or electrically conductive particles, and thereafter heating the admixture for a time sufficient to flux and cure same to obtain a conductive thermoset material. Upon heating, above the plasticization temperature, the liquid reactive plasticizer plasticizes the polymer particles. This results in the swelling of the polymer particle, forcing the conductive filler to pack tightly and orderly, thereby increasing the conductivity of the plasticized conductive thermoset after curing.

20 Claims, 2 Drawing Figures

Concept of Conductive Plastic

Concept of Conductive Plastic

CONDUCTIVE THERMOSETTING COMPOSITIONS AND PROCESS FOR USING SAME

BACKGROUND OF THE INVENTION

1. Field of the Invention

This invention relates to a conductive thermosettable dispersion composition which, on heating at or above the plasticization temperature, rapidly provides a conductive thermoset material with improved conductivity usable as an ink, adhesive, gasket, sealant or in EMI and RF shielding.

The invention also relates to a process for forming a conductive crosslinked bond or seal.

2. Description of the Prior Art

Conductive coatings are known in the art.

U.S. Pat. No. 3,412,043 teaches an electrically conductive resinous composition consisting essentially of silver flake, resinous binder and finally divided inert filler in specified weight ratios. Therein one resinous binder is an epoxy resin system which is cured by the addition of an amine curing agent at slightly elevated temperatures.

U.S. Pat. No. 3,746,662 teaches electrically conductive coatings comprising certain epoxy resins, particles of tough polymer having carboxy, hydroxy, amino or isocyanate substituents which are grafted by the epoxy resin at the interface, finely divided metal particles and a curing agent for the epoxy resin. The curing is obtained by heating the composition at temperatures of 125° C. or higher.

U.S. Pat. No. 3,968,056 teaches a radiation curable ink comprising a particulated electrically conductive metal containing material in combination with an organic resin binder which is converted to a conductive coating on the surface of a substrate by exposure to either actinic or ionizing radiation.

U.S. Pat. No. Re. 30,274 teaches a circuit board for activating high voltage flashlamps, said board including a non-conductive, thermoplastic substrate having a patterned electrically conductive coating on one of its surfaces and defining electrical circuitry for the flashlamps, said coating comprising an organic resin matrix curable by UV radiation and a particulated electrically conductive material selected from the group consisting of a particulated electrically conductive metal and a particulated electrically conductive metal containing material, including mixtures thereof with no more than up to about 15% by weight of said particulated electrically conductive material having an aspect ratio of diameter to thickness of a value greater than 20.

U.S. Pat. No. 3,609,104 teaches the use of compressible, non-flowable particles to promote the conductivity of the conductive plastic. The flowable resin is one that chemically bonds to the surface of the non-flowable particles when it is hardened. During hardening, sufficient pressure is applied to distort the non-flowable particles to induce a conductive web from the conductive filler. For this purpose the non-flowable particles must be compressible.

OBJECTS OF THE INVENTION

One object of the instant invention is to produce a novel process and composition. Another object of the instant invention is to produce a conductive dispersion composition which is useful as an ink, shielding, adhesive or sealant. Yet another object of the instant invention is to produce a conductive dispersion composition which on curing has higher conductivity than conventional conductive thermosets. Still another object of the invention is to produce a conductive dispersion composition which on heating to the plasticization temperature acquires handling strength and cures to a conductive thermoset at or above said plasticization temperature. Yet another object of the invention is to produce a conductive, reactive, plasticized thermosetting polymer composition curable to a conductive, thermoset material on exposure to heat. Other objects will become apparent from a reading hereinafter.

DESCRIPTION OF THE INVENTION

This invention relates to a conductive thermosettable dispersion composition comprising an admixture of
 (a) particles of a polymeric material swellable at its plasticization temperature,
 (b) at least one liquid reactive plasticizer for (a),
 (c) optionally and preferably a thermal curing agent for (b), and
 (d) particles of a heat or electrical conductive material.

This invention is also directed to a process for forming a conductive thermoset material which comprises a thermoplastic polymer, e.g., copolymer of styrene and maleic anhydride, commminuting and admixing said polymer with
 (a) a liquid reactive plasticizer therefor, e.g., an epoxy resin,
 (b) a curing agent for the reactive plasticizer, e.g., dicyandiamide, and
 (c) heat or electrically conductive particles, e.g., silver flake,
and, thereafter, heating the admixture for a time sufficient to plasticize and cure same to obtain a conductive thermoset material.

The conductive, reactive dispersion when plasticized can be used as a gasket, sealant or adhesive.

Originally, plastisols were produced by dispersion of a fine particle size PVC resin in a plasticizer. The PVC resin particles are uniformly distributed throughout the continuous plasticizer phase. A plastisol undergoes several morphological changes upon heating at a temperature above its fusion temperature. First, the PVC particles swell into a pregellation state at which the particles increase their sizes by the absorption of plasticizer molecules and remain flowable in the dispersion state. In the progress of plasticization, the dispersion becomes gel and the liquid phase virtually disappears. The gellation phenomonium provides no physical strength to the gelled dispersion until it turns to the fusion stage. A fused plastisol is a clear continuous plasticized PVC having final physical properties: [A. C. Werner, Tappi, 50(1), 79A (1967)].

Theoretically, the phenomonium of a plastisol is controlled by thermodynamics and transport kinetics. To form a stable dispersion, the plasticizer molecules should not diffuse into the polymer particles to solvate the segments of polymer backbone. That is, the size of the plasticizer molecules should be larger than the free volume of the polymer particles at storage temperature. As soon as the free volume of the polymer particles increases to a certain size, which occurs on heating, the plasticizer begins to diffuse into and solvate the polymer.

Plastization is a process in which the plasticizer migrates into the three dimensional lattice of tne polymer particles resulting in a solvation of the polymer segment by the plasticizer molecules. This reduces the number of points of interaction between segments, but the gel structure from entanglement of polymer molecules retains a degree of resilience and resistance to deformation.

The condition for thermodynamic equilibrium between the p-mixed phase (polymer plus swelling plasticizer) and pure swelling liquid is given by $$\Delta \overline{G}_1 = 0$$

where $\Delta \overline{G}_1$ is the Gibbs free energy of dilution, defined as the change in the Gibbs free energy of the system resulting from the transfer of unit quantity of swelling liquid from the pure liquid phase to a very large quantity of the swollen polymer. For flexible linear polymers, $\Delta \overline{G}_1$ is given by the well known Flory-Huggins equation (M. L. Huggins, J. Chem. Phys., 9, 440 (1941); P. J. Flory, ibid. 9, 660 (1941):

$$\Delta \overline{G}_1 = RT \left[ \ln(1 - v_2) + \left(1 - \frac{1}{\gamma}\right) v_2 + x v_2^2 \right]$$

where $v_2$ is the volume fraction of the polymer, $\gamma$ is the ratio of molar volumes of polymer and solvent and x is an interaction parameter that generally varies from $-1.0$ to slightly over 0.5. If $x < \frac{1}{2}$, $\Delta \overline{G}_1$ is negative for all values of $v_2$ and the polymer is soluble or swellable to equilibrium; if $x > \frac{1}{2}$, there is a particular value of $v_2$ for which $\Delta \overline{G}_1 = 0$ and at this value the polymer is swollen to equilibrium.

Using kinetic and thermodynamic controls based on the principles outlined above, the plastisol concept can be extended to other polymeric materials. Any liquid organic material can be used as plasticizer for a plastisol preparation when the plasticizer is compatible with the polymer and provides a stable dispersion.

This invention utilizes this particular concept to prepare conductive thermosets having improved conductivity over the conventional ones containing only a dispersion of conductive filler in a thermosetting resin. The conductive thermosetting material in this invention contains a conductive filler and a non-crosslinked polymer powder dispersed in a thermosetting plasticizer. Upon heating at curing temperature, polymer powders are swollen by the reactive plasticizer to their maximum volume and, hence, reduce the volume of the liquid phase containing conductive filler. This causes the conductive filler to pack tightly and to form a conductive path web after the conductive thermosetting composition is plasticized at an elevated temperature.

Several advantages can obviously be realized from this novel approach. First, at the same loading of conductive filler, the conductivity of the thermoset prepared from this invention is higher than the conventional conductive thermoset. Second, to reach the same conductivity, the conductive thermoset in this invention can contain less conductive filler than conventional ones resulting in improved rheology and physical properties and cost saving, especially since the conductive filler is an expensive metal such as gold or silver.

FIG. 1 shows the sequence of the morphological change of the conductive thermosets described herein. In the figure, 1 represents the swellable polymer particles, 2 represents the conductive particles, and 3 represents the liquid reactive plasticizer. FIG. 1A is a stable dispersion under storage conditions containing a reactive plasticizer or a mixture of reactive plasticizers 3, a polymer powder 1 and a conductive filler 2. Upon heating at the curing temperature, the polymer particles 1 are swollen through plasticization or solvation by tne reactive plasticizer 3 as shown in FIG. 1-B. The volume fraction of polymer particle 1 is increased and, therefore, the packing densitiy of conductive filler 2 is increased as well. When the polymer particles 1 containing reactive plasticizer 3 swell to their maximum volume, a conductive web of conductive particles 2 is formed. The conductive web of conductive particles 2 and the size of swollen polymer particles 1 and 3 become permanent after the polymerization or the crosslinking reaction of the reactive plasticizer as shown in FIG. 1C.

Hence, this invention relates to the use of swellability of polymer powder at an elevated temperature above the plasticization temperature to cause the conductive filler to pack tightly and to arrange orderly and, hence, to increase the conductivity of the conductive thermoset. The reactive plasticizer such as a liquid epoxy does not need to have low viscosity. The essential requirements for the reactive plasticizer are (1) not to swell the polymer powder at room temperature, (2) to maintain the viscosity of the dispersion, (3) to be able to plasticize the polymer powder at an elevated temperature at or above the plasticization point and (4) to be polymerizable or curable. Therefore, any polymerizable or thermosettable resin can be used as the reactive plasticizer when it meets these requirements.

The polymer powder has to be swellable by the reactive plasticizer upon heating at or above the plasticization temperature. Additionally, the particles of polymeric material can have reactive functional groups such as —COOH, —OH, —NH$_2$ or —NCO present but such groups are not necessary, and higher conductivity for a given amount of conductive fillers is dependent on the solvation of the polymer particles by the reactive plasticizer and the plasticizers' subsequent polymerization or curing.

In this invention, a series of conductive thermosets prepared by conventional method and containing only silver particles and epoxy resin (Epon-828) was used as reference to illustrate the conductivity improvement of the thermosets when the concept is used. The polymer powders utilized for demonstration include an isobutene-maleic anhydride copolymer and a styrene-maleic anhydride copolymer. Of course, any polymer powder swellable in a reactive plasticizer can be applied to this invention. The polymer powder in the instant invention can be, but is not limited to, polyethylene, polypropylene, polyphenylene oxide, polymethacrylate, polyacrylate, polyvinyl chloride, polystyrene, polyacrylonitrile, polyimide, polyvinyl acetate, polyvinyl acetal, polyphenylene sulfide, poly(aromatic sulfone), polyvinyl alcohol and many others, and copolymers of these homopolymers.

In the present invention a reactive plasticizer is a liquid material which can solvate polymer powder at a temperature equal to or above the plasticization point and is polymerizable or crosslinkable under polymerization or curing conditions. Therefore, the reactive plasticizer or a mixture of reactive plasticizers in the dispersion will become a plastic, either thermoplastic or thermoset, interpenetrated in the swollen powdered polymer after the plasticization and polymerization or curing. Reactive plasticizers applicable to this invention include various types of monomers and thermosetting resins. Monomers include, but are not limited to, styrene, methacrylates, acrylates, epoxides, diisocyanates, diols, dianhydrides, diamines and dicarboxylic acids which are all suitable as reactive plasticizers. The thermosetting reactive plasticizers include, but are not limited to, epoxy resin, polyfunctional isocyanate, melamine resin, phenolics, polyols, polyamines and the like.

The curing agent employed in the instant invention is dependent upon the type of liquid reactive plasticizer. In certain instances the curing agent is not necessary but can be optionally employed. Examples of this type of liquid reactive plasticizer are acrylic or methacrylic terminated monomers, oligomers or prepolymers which materials are self-polymerizing on heating. However, to increase the reaction rate of the polymerization, free radical generators such as organic peroxides are usually employed. Other liquid reactive plasticizers which are polymerized or crosslinked by free radical generators include, but are not limited to liquid butadiene copolymers and reactive unsaturated olefins. In the instances where free radical generators are used, they are usually present in an amount ranging from 0.001 to 10% by weight of the liquid reactive plasticizer. In other instances such as in the polymerization or crosslinking of epoxy resin with cationic $BF_3$ amine complex or anionic amine initiators, the amount of the initiator ranges from 0.001 to 10% by weight of the liquid reactive plasticizer. In the instance where the liquid reactive plasticizer is an epoxy resin and the initiator is dicyandiamide or an amine adduct, amounts of initiator present range up to the stoichiometric amount necessary to react with the epoxy groups present in the plasticizer. In the instance where a mixture of reactive plasticizers is employed which require different curing agents, a combination of curing agents including those operable for each of the reactive plasticizers should be used. Thus, for example, when an acrylate terminated reactive plasticizer is admixed with an epoxy plasticizer, both an organic peroxide and either a cationic or anionic initiator or dicyandiamide should be combined to insure that both reactive plasticizers are cured.

In the instance where the polymer powder has functional groups for curing the reactive plasticizer, the additional curing agent may not be needed in the conductive thermosetting composition.

The electrically conductive material herein can be in the form of particles, spheres, beads, powder, fibers, flakes or mixtures thereof. By "electrically conductive material", as used herein, is meant the electrically conductive material, per se, not including any substrate on which it may be coated. Aside from the noble metals and noble metal coated substrates which can be used as the electrically conductive material herein, the use of other metals such as copper, aluminum, iron, nickel and zinc are also contemplated. Also employable are silver coated glass spheres sometimes referred to as "beads" which have an average diameter of about 6 to 125 microns. These materials are made from glass spheres commonly employed as reflective filler materials and are commercially available. Additionally, glass fibers coated with silver, copper or nickel as shown in French Patent No. 1,531,272 can also be employed. Electrically conductive material used herein also includes carbon black and graphite.

In the instant process the amount of the electrically conductive material needed for conductance is in the range 1 to 80 weight percent of the conductive composition employed, preferably 5–70 weight percent on the same basis with the balance being the thermoset material consisting of the particles of the polymeric material, reactive plasticizer and curing agent for the plasticizer.

The electrically conductive material employed herein can be used in various sizes depending on its form. For best results, the major dimension of the electrically conductive material should be no greater than about 400 microns. Prefably, the electrically conductive material has a major dimension in the range 10 to 60 microns.

In the thermoset material the amount of the particles of the polymeric material can range from 0.0001 to 70%, preferably 0.1 to 30% by weight, with the balance making up to 100% by weight being the liquid reactive plasticizer.

In carrying out the instant invention, the conductive thermosettable dispersion composition is heated to the plasticization temperature of the plasticizing components. This temperature will vary in the range 40° to 250° C. depending on which polymeric material and which reactive plasticizer is used. The crosslinking or polymerization reaction of the liquid reactive plasticizer is carried out at a temperature in the range 40° to 250° C. dependent upon the liquid reactive plasticizer and curing agent.

The heating step can be carried out by various means. In simple systems wherein the conductive thermoset material is to be used as an adhesive, the adhesive can be applied by manual means to an adherend, contacted by another adherend and the assembled system heated in a forced air oven until a conductive thermoset bond results. Additionally, electromagnetic heating including induction heating and dielectric heating can also be utilized for faster cures.

The following examples are set forth to explain, but expressly not limit, the instant invention. Unless otherwise noted, all parts and percentages are by weight. Conductivity measurements were made using a two-probe Simpson meter on a cured sample, 50 mm. in length, 3.2 mm. in width and with a thickness measured with a micrometer.

EXAMPLE 1

Figure 2:
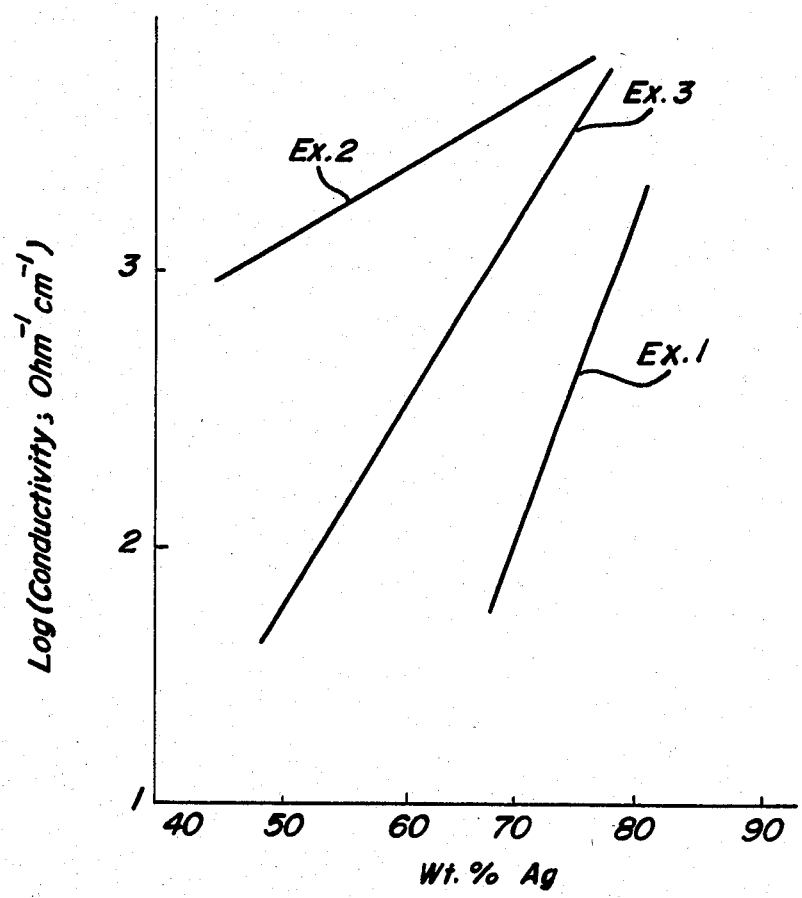

A known amount of silver ($<74\mu$) was dispersed in 10 g of liquid diglycidyl ether of bisphenol-A, commercially available from Shell under the tradename "Epon-828", containing 0.6 g of dicyandiamide. The sample was cured in a cell with a diameter of 0.5" and a thickness of 0.06" at 170° C. for 30 minutes. The cured plate was placed between two electrodes to measure its conductivity. The results are shown in FIG. 2.

EXAMPLE 2

A known amount of silver ($<74\mu$) was dispersed in a plastisol containing 2 g of isobutene-maleic anhydride copolymer, 8 g of Araldite CY-179 (3,4-epoxycyclohexyl-methyl-3,4-epoxycyclohexane carboxylate; Ciba-Geigy). The curing and conductivity measurement procedures are the same as those described in Example 1. The results are also shown in FIG. 2.

EXAMPLE 3

A known amount of silver ($<74\mu$) was dispersed in a plastisol containing 2.5 g of a commercially available styrene maleic anhydride copolymer and 7.5 g of Epon-828. The curing and conductivity measurement procedures are the same as those described in Example 1. The results and the calculated silver savings are also shown in FIG. 2.

The conclusions from FIG. 2 are (1) the conductive thermoset (Example 1) without the addition of polymer powder has the lowest conductivity of the three examples at the same level of silver content; (2) the enhancement of conductivity depends on the type and amount of the polymer powder in the composition; and (3) to maintain the same level of conductivity, the conductive thermoset containing polymer powder requires a lower silver content than the conventional conductive thermoset.

We claim:

1. A conductive, thermosettable, reactive plastisol dispersion composition comprising an admixture of
    (a) particles of a non-crosslinked, polymeric material swellable at its plasticization temperature,
    (b) at least one liquid, reactive plasticizer for (a), and
    (c) particles of a heat or electrically conductive material, the weight ratio of (a):(b) being 0.0001:99.9999 to 70:30 with (c) being present in an amount in the range 1 to 80% by weight of the total conductive, thermosetable, reactive plastisol dispersion composition.

2. The composition of claim 1 containing in addition a thermal curing agent for (b).

3. The composition of claim 1 wherein the polymeric material is an epoxy resin.

4. The composition of claim 1 wherein the polymeric material is an isobutene-maleic anhydride copolymer.

5. The composition of claim 1 wherein the polymeric material is a styrene-maleic anhydride copolymer.

6. The composition of claim 2 wherein the polymeric material is an epoxy resin.

7. The composition of claim 2 wherein the polymeric material is an isobutene-maleic anhydride copolymer.

8. The composition of claim 2 wherein the polymer material is a styrene-maleic anhydride copolymer.

9. The method of making a conductive thermoset article comprising the steps of admixing
    (a) particles of a non-crosslinked, polymeric material swellable at its plasticization temperature,
    (b) at least one liquid reactive plasticizer for (a), and
    (c) particles of a heat or electrically conductive material to form a conductive reactive plastisol composition, the weight ratio of (a):(b) being 0.0001:99.9999 to 70:30 with (c) being present in an amount in the range 1 to 80% by weight of the conductive, reactive plastisol composition and, thereafter, heating the composition for a time sufficient to plasticize and cure same to obtain a conductive thermoset article.

10. The method according to claim 9 wherein the admixture also contains a thermal curing agent for (b).

11. A method according to claim 9 wherein the polymeric material is an epoxy resin 12. A method according to claim 9 wherein the polymeric material is an isobutene-maleic anhydride copolymer.

13. A method according to claim 9 wherein the polymeric material is a styrene-maleic anhydride copolymer.

14. The composition of claim 10 wherein the polymeric material is an epoxy resin.

15. The composition of claim 10 wherein the polymeric material is an isobutene-maleic anhydride copolymer.

16. The composition of claim 10 wherein the polymeric material is a styrene-maleic anhydride copolymer.

17. The composition of claim 1 as a conductive coating on a substrate.

18. The composition of claim 2 as a conductive coating on a substrate.

19. The composition of claim 1 as a conductive adhesive between two substrates.

20. The composition of claim 2 as a conductive adhesive between two substrates.

* * * * *